United States Patent
Yang et al.

(10) Patent No.: US 10,396,188 B1
(45) Date of Patent: Aug. 27, 2019

(54) HETEROJUNCTION BIPOLAR TRANSISTORS AND METHOD OF FABRICATING THE SAME

(71) Applicant: QUALCOMM Incorporated, San Diego, CA (US)

(72) Inventors: Bin Yang, San Diego, CA (US); Gengming Tao, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/962,859

(22) Filed: Apr. 25, 2018

(51) Int. Cl.
*H01L 29/66* (2006.01)
*H01L 29/737* (2006.01)
*H01L 27/082* (2006.01)
*H01L 29/205* (2006.01)
*H01L 29/06* (2006.01)

(52) U.S. Cl.
CPC ...... *H01L 29/7371* (2013.01); *H01L 27/0823* (2013.01); *H01L 29/0649* (2013.01); *H01L 29/205* (2013.01); *H01L 29/66318* (2013.01)

(58) Field of Classification Search
USPC .......... 257/197, E29.135, 194, 192, 285, 257/E29.246–E29.253, 20, E21.395, 257/E21.399, E21.403, E21.407, 257/552–562, E29.033, 163–166, 205, 257/273, 361, 378, 423, 427, 474, 477, 257/517, 526, 539, 544, 565–593, 928, 257/E51.004, E27.017, E27.019–E27.023, 257/E27.037–E27.043, E27.053–E27.058, 257/E27.074–E27.078, E27.106, E27.149, 257/E29.03–E29.035, E29.044–E29.045, 257/E29.114, E29.124, E21.372, 257/E21.38–E21.381, E21.369–E21.393, 257/E21.608–E21.613, E31.069; 438/167, 172, 235–238
See application file for complete search history.

(56) References Cited

U.S. PATENT DOCUMENTS 5,949,097 A * 9/1999 Hirata .................. H01L 27/0605
257/197
2014/0167116 A1* 6/2014 Chevalier ............ H01L 21/8249
257/197

OTHER PUBLICATIONS

He G., et al., "Recent Advances in InP DHBT Manufacturing Technology," IEDM '06. International Electron Devices Meeting, Dec. 11-13, 2006, 4 pages.

\* cited by examiner

*Primary Examiner* — Niki H Nguyen

(57) ABSTRACT

A semiconductor device comprises a heterojunction bipolar transistor (HBT). The HBT comprises an emitter, a collector, and a base between the emitter and the collector. A width of the emitter may be smaller than 100 nanometers, which is suitable for high speed applications.

25 Claims, 17 Drawing Sheets

US 10,396,188 B1

HETEROJUNCTION BIPOLAR TRANSISTORS AND METHOD OF FABRICATING THE SAME

BACKGROUND

Field

Certain aspects of the present disclosure generally relate to integrated circuits (ICs), and more particularly, to heterojunction bipolar transistors.

Background

Heterojunction bipolar transistor (HBT) is a type of bipolar junction transistor (BJT) in which at least one of its two junctions is formed between different semiconductor materials. HBTs comprise an emitter, a collector, and a base between the emitter and the collector. The emitter emits charge carriers. The base controls the number of charge carriers emitted by the emitter and the collector collects the charge carriers emitted by the emitter. Compared with traditional BJTs, HBTs excel in terms of base resistance, base-emitter capacitance, and cutoff frequency. HBTs also offer good linearity, low phase noise, and high power efficiency. Thus, they are the transistors of choice for many wireless communication systems, such as cellphones.

HBTs are suitable for both high power applications and high speed applications and are widely used in wireless communication systems. For high power applications, a large emitter width is required for power handling purpose, such as an emitter width of 0.1 micron (µm) to 3 µm. For high speed applications, a small emitter width is desirable. As the emitter width shrinks, the base-emitter capacitance decreases, which leads to an increase in the cutoff frequency (ft) and the maximum oscillation frequency (fmax) of the HBT. Thus, a smaller emitter width is beneficial for high speed applications.

With conventional fabrication method, the emitter width can be as small as 0.1 µm. However, it is difficult to further reduce the emitter width. Meanwhile, using conventional fabrication process, it is difficult to fabricate HBTs for both high power applications and high speed applications on a single die due to their different requirements for emitter width. Thus, there is a need for HBTs for high speed applications with small emitter width which can be integrated with HBTs for high power applications on a single die.

SUMMARY

Certain aspects of the present disclosure provide a semiconductor device. The semiconductor device may include a first heterojunction bipolar transistor (HBT) on a die. The first HBT may include a first emitter, a first collector, and a first base between the first emitter and the first collector and a width of the first emitter may be smaller than 100 nanometers.

Certain aspects of the present disclosure provide a method for fabricating a semiconductor device. The method may include forming a first heterojunction bipolar transistor (HBT) on a substrate, wherein the first HBT may include a first emitter, a first collector, and a first base between the first emitter and the first collector and wherein a width of the first emitter may be smaller than 100 nanometers. The method may also include forming a second HBT on the substrate, wherein the second HBT may include a second emitter, a second collector, and a second base between the second emitter and the second collector and wherein a width of the second emitter may be equal to or larger than 0.1 micron.

This summary has outlined, rather broadly, the features and embodiments of the present disclosure so that the following detailed description may be better understood. Additional features and embodiments of the present disclosure will be described below. It should be appreciated by those skilled in the art that this disclosure may be readily utilized as a basis for modifying or designing other equivalent structures for carrying out the same purposes of the present disclosure. It should also be realized by those skilled in the art that such equivalent constructions do not depart from the teachings of the present disclosure as set forth in the appended claims. The features, which are believed to be characteristic of the present disclosure, both as to its organization and method of operation, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
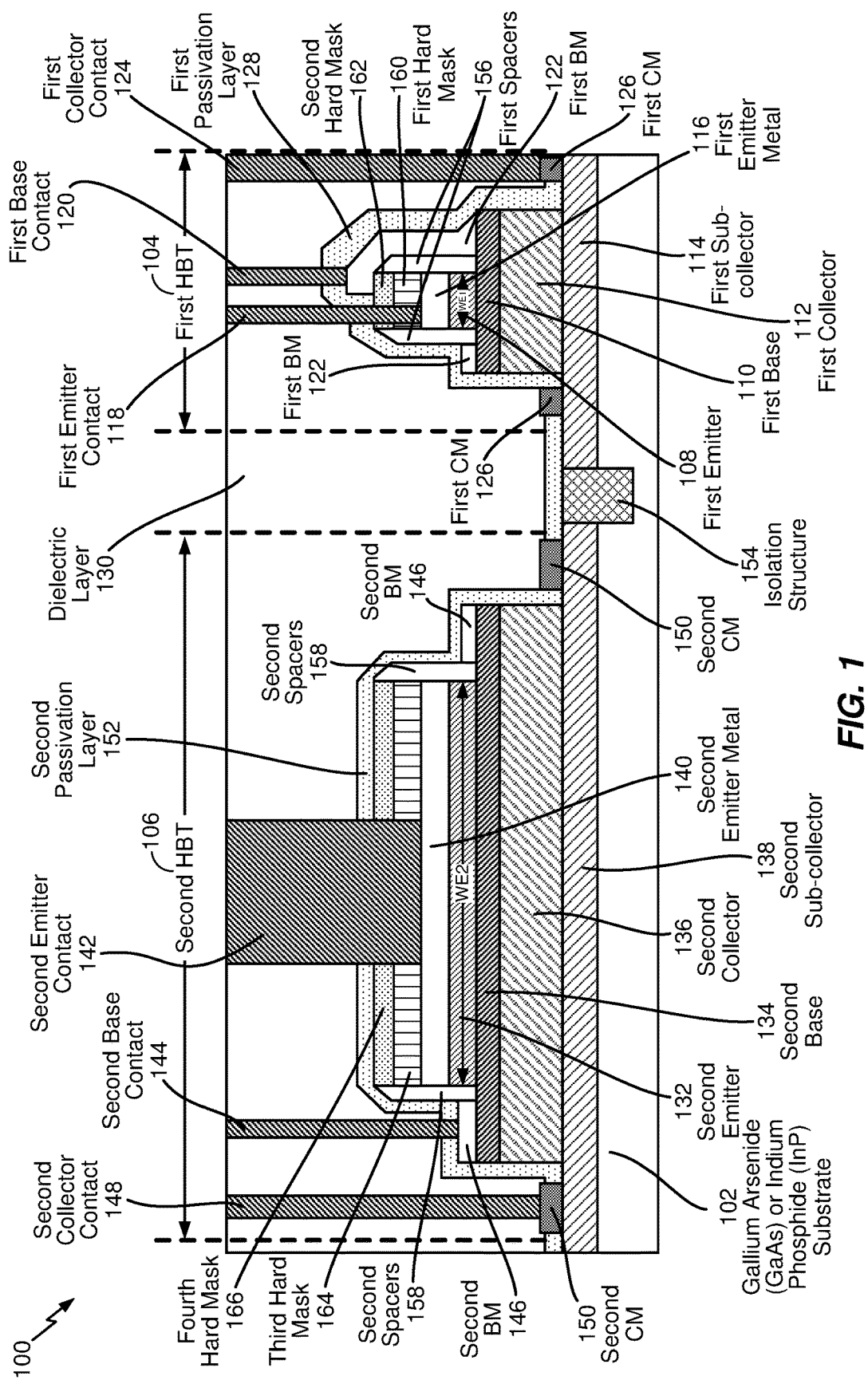
FIG. 1 is a cross-sectional diagram of an exemplary semiconductor device having two heterojunction bipolar transistors (HBTs) with different emitter widths integrated on a single die in accordance with certain aspects of the present disclosure.

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The detailed description set forth below, in connection with the appended drawings, is intended as a description of various aspects and is not intended to represent the only aspect in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts.

Aspects disclosed in the detailed description include two heterojunction bipolar transistors (HBTs) with different emitter widths integrated on a single die for both high power applications and high speed applications. In certain aspects, a semiconductor device comprises a first HBT and a second HBT. The first HBT comprises a first emitter, a first collector, and a first base between the first emitter and the first collector. The second HBT comprises a second emitter, a second collector, and a second base between the second emitter and the second collector. The first HBT and the second HBT are integrated on a single die and are electrically isolated by an isolation structure. A width of the first emitter may be smaller than 100 nanometers (nm), which is suitable for high speed applications. A width of the second emitter may be equal to or larger than 0.1 micron (μm), which is suitable for high power applications.

In this regard, FIG. 1 illustrates an exemplary semiconductor device having two HBTs with different emitter widths integrated on a single die in accordance with certain aspects of the present disclosure. A semiconductor device 100 is shown in FIG. 1, which comprises a first HBT 104 and a second HBT 106 on a single die. As an example, the single die may comprise a Gallium Arsenide (GaAs) or an Indium Phosphide (InP) substrate 102. The first HBT 104 comprises a first emitter 108, a first collector 112, and a first base 110 between the first emitter 108 and the first collector 112. As an example, the first emitter 108 may comprise an N+ Indium Gallium Arsenide (InGaAs), N+ GaAs, or N+ InP emitter. The first base 110 may comprise a P+ Indium Gallium Phosphide (InGaP), P+ Aluminum Gallium Arsenide (AlGaAs), P+ Gallium Indium Antimonide (GaInSb), or P+ InP base. The first collector 112 may comprise an N− GaAs or N− InP collector. The first HBT 104 may also comprise a first sub-collector 114 in contact with the first collector 112 and a first emitter metal 116 on the first emitter 108. As an example, the first sub-collector 114 may comprise an N+ GaAs or N+ InP sub-collector. The first emitter metal 116 may comprise Titanium (Ti)/Platinum (Pt)/Gold (Au), Titanium Nitride (TiN), Tungsten (W), or Tungsten Silicon Nitride (WSiN). The first HBT 104 may further comprise a first emitter contact 118 on the first emitter metal 116, first base metals (BM) 122 on the first base 110, a first base contact 120 in contact with the first BM 122, first collector metals (CM) 126 on the first sub-collector 114, a first collector contact 124 in contact with the first CM 126, first spacers 156 in contact with sidewalls of the first emitter metal 116 and the first emitter 108, and a first passivation layer 128. As an example, the first emitter contact 118, the first base contact 120, and the first collector contact 124 may comprise W, W/Au, or W/Copper (Cu). The first BM 122 may comprise Pt/Ti/Pt/Au. The first CM 126 may comprise Au, Germanium (Ge), or Nickel (Ni)/Au. The first spacers 156 may comprise Silicon Dioxide (SiO$_2$). The first passivation layer 128 may comprise Silicon Nitride (SiN). Additionally, the first HBT 104 may comprise a first hard mask 160 and a second hard mask 162 on the first emitter metal 116. As an example, the first hard mask 160 may comprise SiO$_2$. The second hard mask 162 may comprise SiN.

With continuing reference to FIG. 1, the second HBT 106 comprises a second emitter 132, a second collector 136, and a second base 134 between the second emitter 132 and the second collector 136. As an example, the second emitter 132 may comprise an N+ InGaAs, N+ GaAs, or N+ InP emitter. The second base 134 may comprise a P+ InGaP, P+ AlGaAs, P+ GaInSb, or P+ InP base. The second collector 136 may comprise an N− GaAs or N− InP collector. The second HBT 106 may also comprise a second sub-collector 138 in contact with the second collector 136 and a second emitter metal 140 on the second emitter 132. As an example, the second sub-collector 138 may comprise an N+ GaAs or N+ InP sub-collector. The second emitter metal 140 may comprise Ti/Pt/Au, TiN, W, or WSiN. The second HBT 106 may further comprise a second emitter contact 142 on the second emitter metal 140, second BM 146 on the second base 134, a second base contact 144 in contact with the second BM 146, second CM 150 on the second sub-collector 138, a second collector contact 148 in contact with the second CM 150, second spacers 158 in contact with sidewalls of the second emitter metal 140 and the second emitter 132, and a second passivation layer 152. As an example, the second emitter contact 142, the second base contact 144, and the second collector contact 148 may comprise W, W/Au, or W/Cu. The second BM 146 may comprise Pt/Ti/Pt/Au. The second CM 150 may comprise Au, Ge, or Ni/Au. The second spacers 158 may comprise SiO$_2$. The second passivation layer 152 may comprise SiN. Additionally, the second HBT 106 may comprise a third hard mask 164 and a fourth hard mask 166 on the second emitter metal 140. As an example, the third hard mask 164 may comprise SiO$_2$. The fourth hard mask 166 may comprise SiN.

With continuing reference to FIG. 1, the first HBT 104 and the second HBT 106 may be embedded in a dielectric layer 130. As an example, the dielectric layer 130 may comprise Polyimide (PI) or Benzocyclobutene (BCB). The first HBT 104 and the second HBT 106 may be separated by an isolation structure 154 to electrically isolate the first HBT 104 from the second HBT 106.

A width of the first emitter 108 (WE1 in FIG. 1) may be smaller than 100 nm. A width of the second emitter 132 (WE2 in FIG. 1) may be equal to or larger than 0.1 μm. As mentioned in the background, the first HBT 104 may be suitable for high speed applications and the second HBT 106 may be suitable for high power applications. In the semiconductor device 100, the first HBT 104 and the second HBT 106 are integrated to accomplish both high power applications and high speed applications on the single die.

Figure 2A:
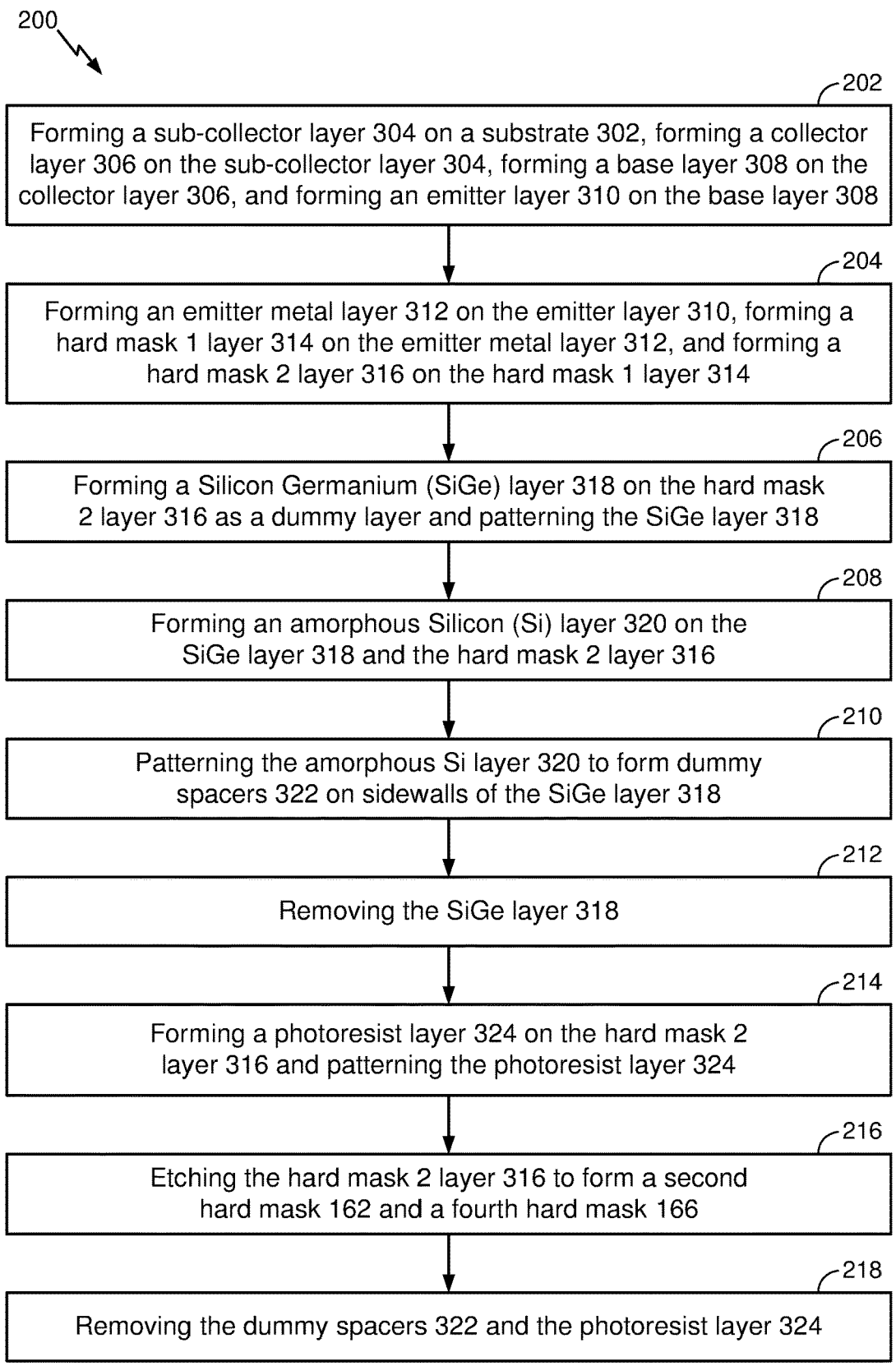
FIGS. 2A-2B provide a flow chart illustrating an exemplary fabrication process for the semiconductor device of FIG. 1 in accordance with certain aspects of the present disclosure.
Figure 2B:
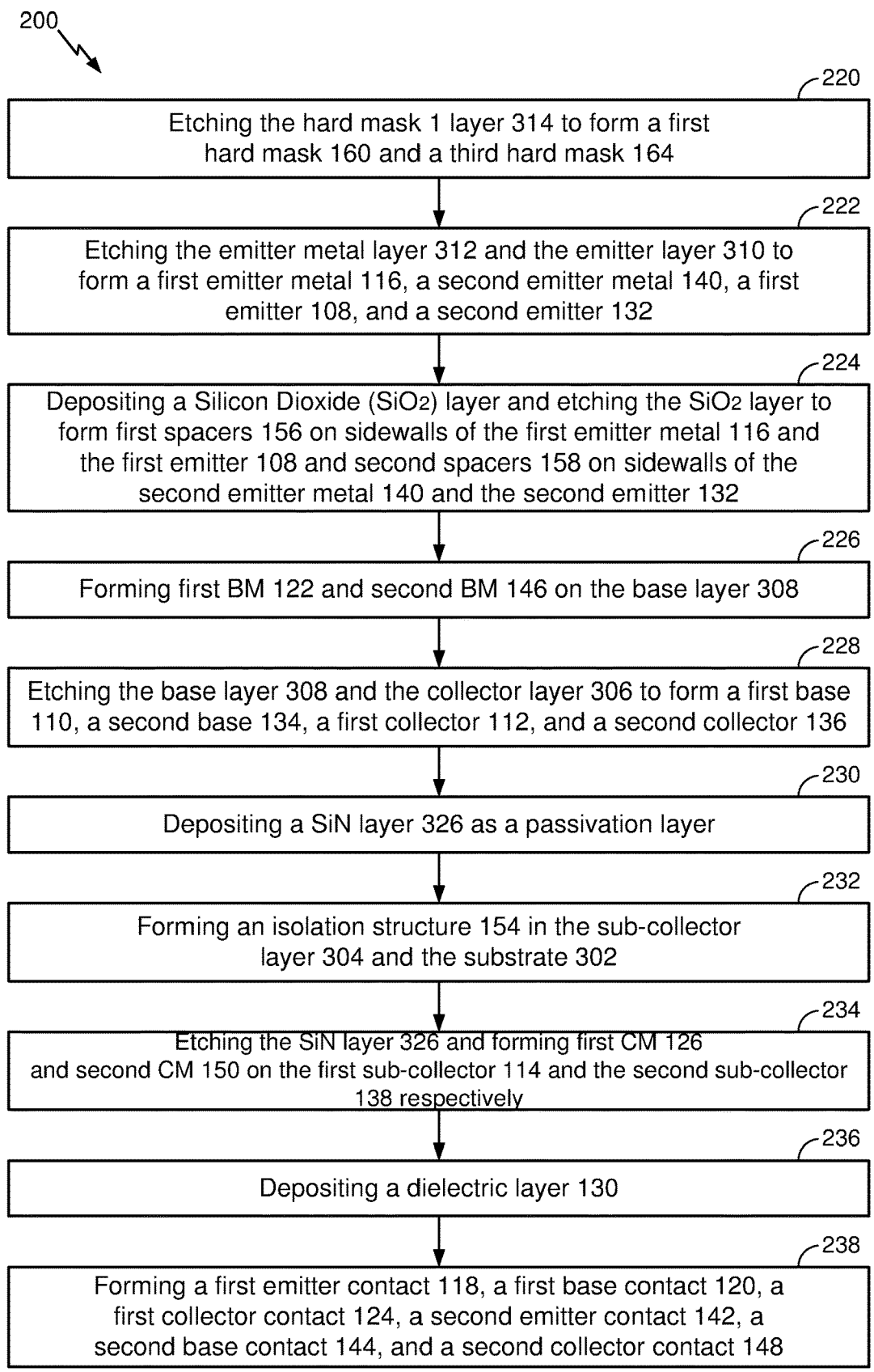

FIGS. 2A-2B illustrate an exemplary fabrication process 200 for the semiconductor device 100 in FIG. 1 in accordance with certain aspects of the present disclosure. FIGS. 3A-3M provide cross-sectional diagrams of the semiconductor device 100 of FIG. 1 illustrating respective stages 300(1)-300(19) of the fabrication process 200 in FIGS. 2A-2B. The cross-sectional diagrams illustrating the semiconductor device 100 in FIGS. 3A-3M will be discussed in conjunction with the discussion of the exemplary steps in the fabrication process 200 in FIGS. 2A-2B.

Figure 3A:
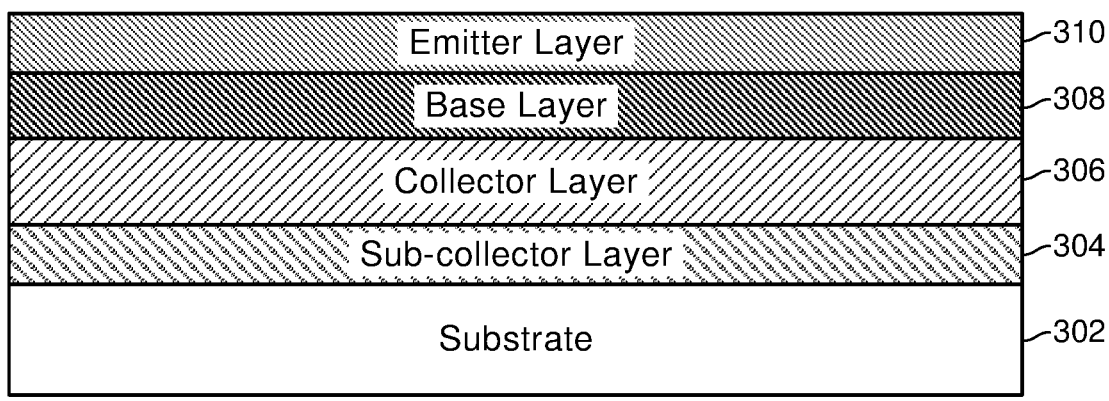
FIGS. 3A-3M provide cross-sectional diagrams of the semiconductor device of FIG. 1 at each stage of the process of fabrication in FIGS. 2A-2B.
Figure 3A:
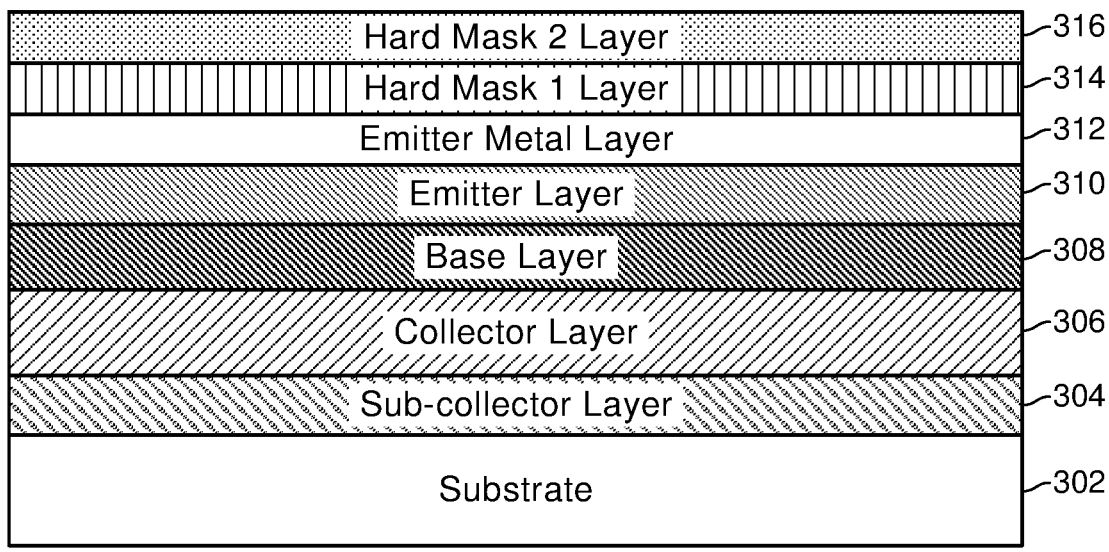

In this regard, the fabrication process 200 in FIGS. 2A-2B includes forming a sub-collector layer 304 on a substrate 302, forming a collector layer 306 on the sub-collector layer 304, forming a base layer 308 on the collector layer 306, and forming an emitter layer 310 on the base layer 308 (block 202, stage 300(1) of FIG. 3A). As an example, the substrate 302 may comprise GaAs or InP. The sub-collector layer 304 may comprise N+ GaAs or N+ InP. The collector layer 306 may comprise N− GaAs or N− InP. The base layer 308 may comprise P+ InGaP, P+ AlGaAs, P+ GaInSb, or P+ InP. The emitter layer 310 may comprise N+ InGaAs, N+ GaAs, or N+ InP. The sub-collector layer 304, the collector layer 306, the base layer 308, and the emitter layer 310 may be formed by epitaxy.

The fabrication process 200 also includes forming an emitter metal layer 312 on the emitter layer 310, forming a hard mask 1 layer 314 on the emitter metal layer 312, and forming a hard mask 2 layer 316 on the hard mask 1 layer 314 (block 204, stage 300(2) of FIG. 3A). As an example, the emitter metal layer 312 may comprise Ti/Pt/Au, TiN, W, or WSiN. The hard mask 1 layer 314 may comprise SiO$_2$ with a thickness of 5 nm. The hard mask 2 layer 316 may comprise SiN with a thickness of 5 nm. The emitter metal layer 312 may be formed by physical vapor deposition (PVD). The hard mask 1 layer 314 and the hard mask 2 layer 316 may be formed by chemical vapor deposition (CVD), such as plasma enhanced chemical vapor deposition (PECVD).

Figure 3B:
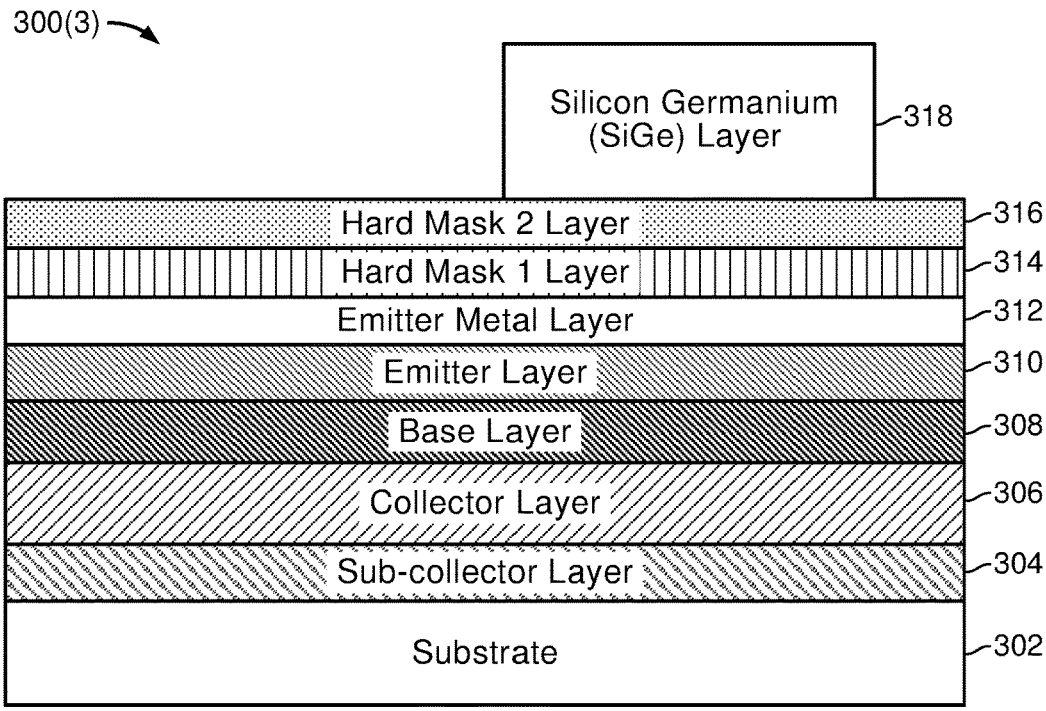
Figure 3B:
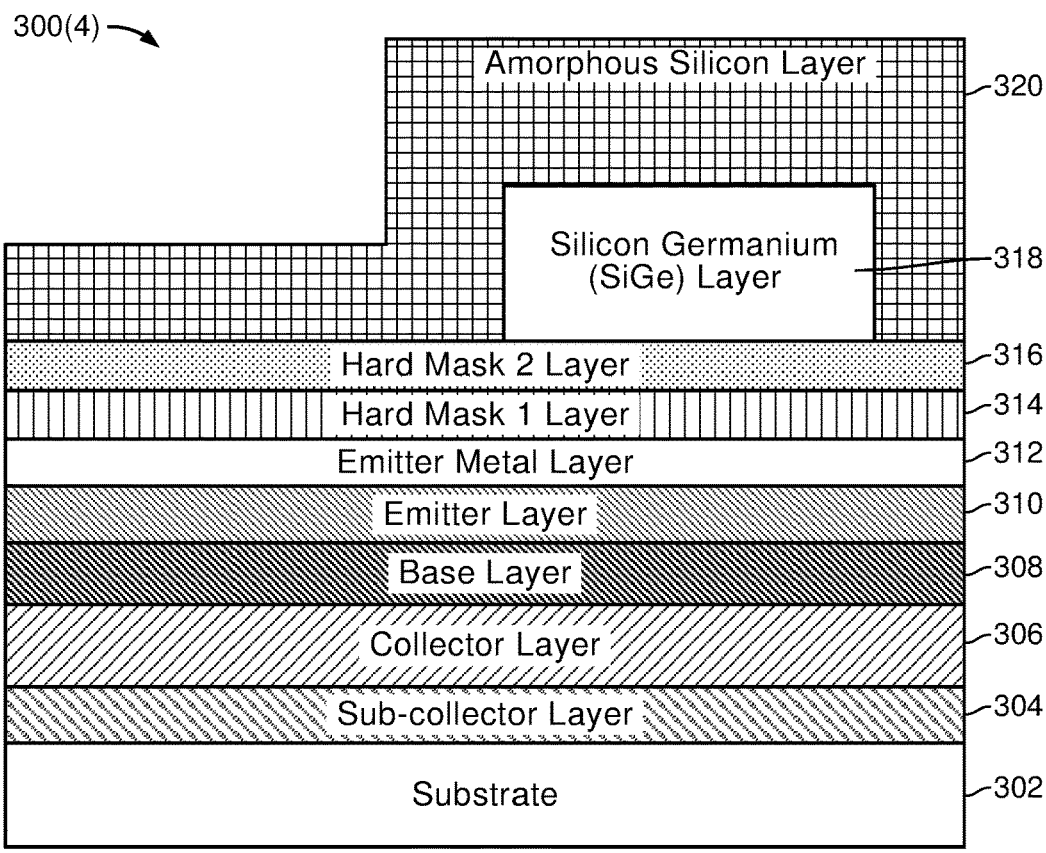

The fabrication process 200 also includes forming a Silicon Germanium (SiGe) layer 318 on the hard mask 2 layer 316 as a dummy layer and patterning the SiGe layer 318 (block 206, stage 300(3) of FIG. 3B). As an example, the SiGe layer 318 may be formed by PECVD with a thickness between 5 nm and 1.5 µm. The germanium percentage in the SiGe layer 318 may be equal to or larger than 50%. The SiGe layer 318 may be patterned by photolithography and dry etching.

The fabrication process 200 also includes forming an amorphous Silicon (Si) layer 320 on the SiGe layer 318 and the hard mask 2 layer 316 (block 208, stage 300(4) of FIG. 3B). As an example, the amorphous Si layer 320 may be formed by PVD with a thickness smaller than 100 nm (e.g., between 5 nm and 10 nm).

Figure 3C:
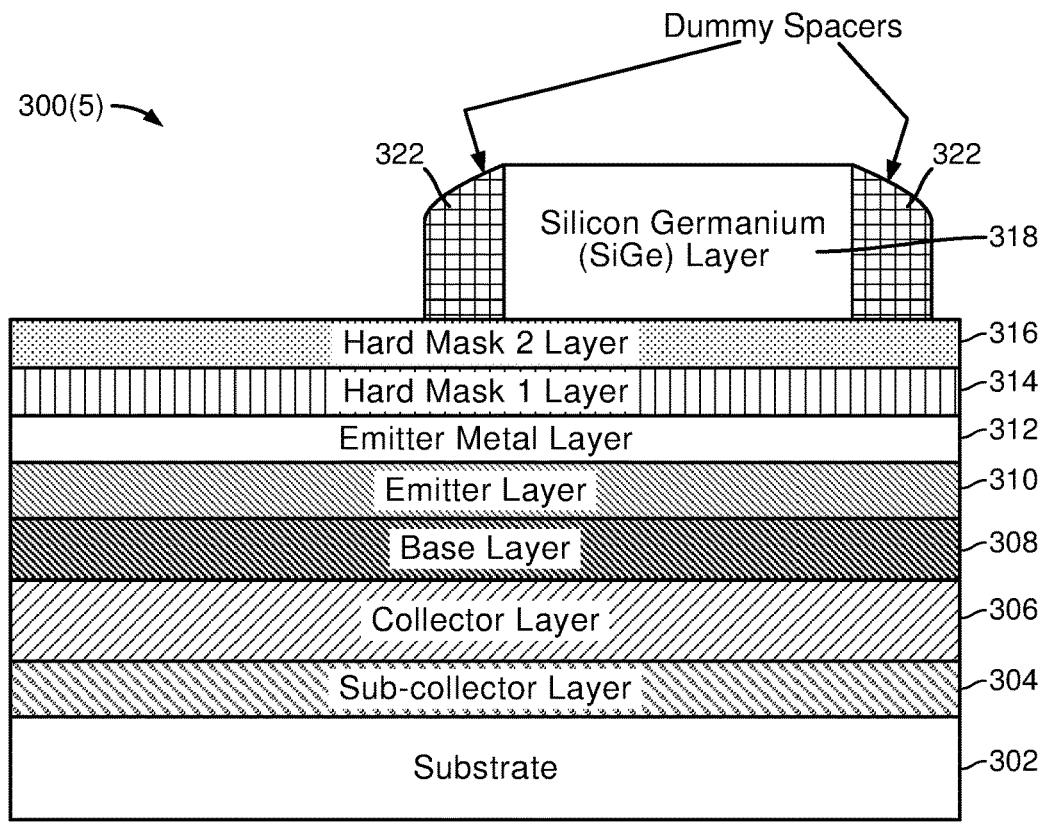
Figure 3C:
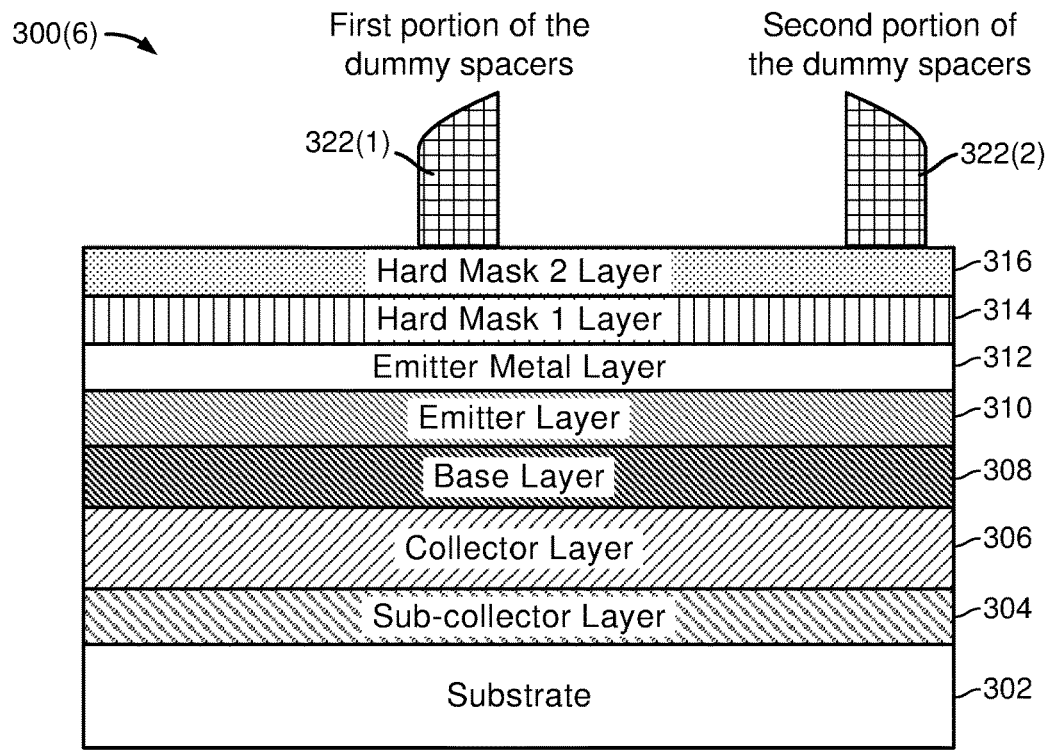

The fabrication process 200 also includes patterning the amorphous Si layer 320 to form dummy spacers 322 on sidewalls of the SiGe layer 318 (block 210, stage 300(5) of FIG. 3C). As an example, the dummy spacers 322 may be formed from the amorphous Si layer 320 through dry etching.

The fabrication process 200 also includes removing the SiGe layer 318 (block 212, stage 300(6) of FIG. 3C). As an example, the SiGe layer 318 may be removed through wet etching. After removing the SiGe layer 318, the dummy spacers 322 may comprise a first portion 322(1) and a second portion 322(2). A width of the first portion 322(1) of the dummy spacers 322 and a width of the second portion 322(2) of the dummy spacers 322 may be smaller than 100 nm (e.g., between 5 nm and 10 nm). The following fabrication process for the first portion 322(1) of the dummy spacers 322 and the second portion 322(2) of the dummy spacers 322 is the same. Thus, only the first portion 322(1) of the dummy spacers 322 is shown in the following fabrication steps to illustrate the remaining fabrication process.

Figure 3D:
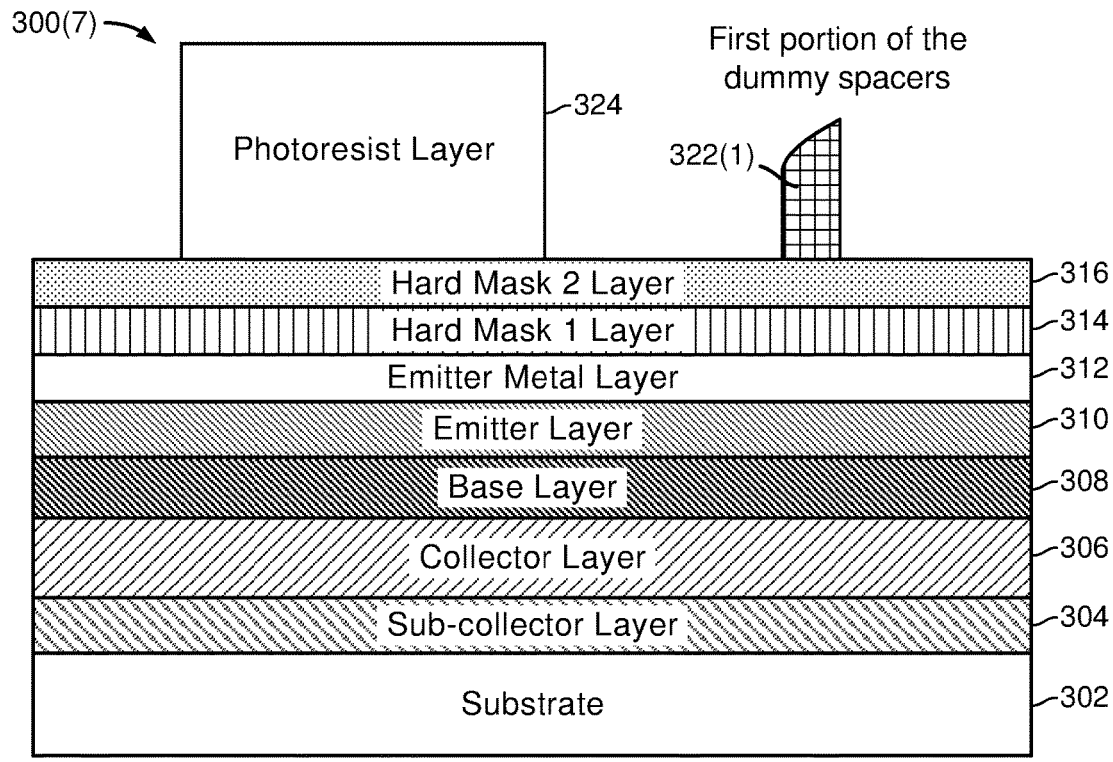
Figure 3D:
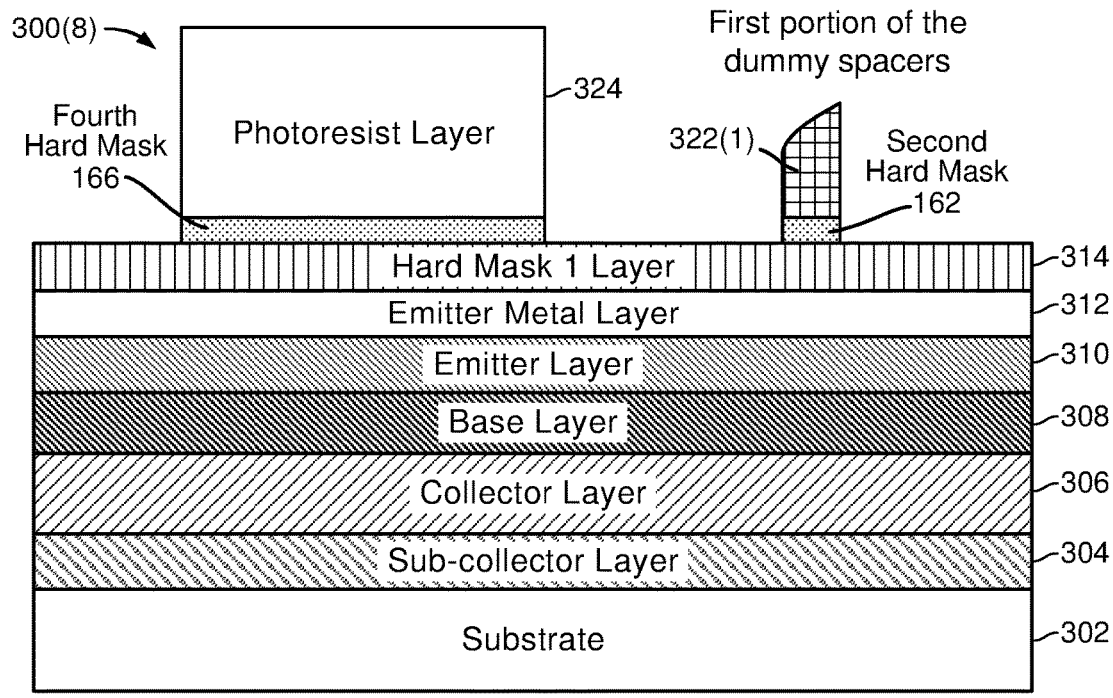

The fabrication process 200 also includes forming a photoresist layer 324 on the hard mask 2 layer 316 and patterning the photoresist layer 324 (block 214, stage 300(7) of FIG. 3D). As an example, after patterning the photoresist layer 324, the first portion 322(1) of the dummy spacers 322 and the photoresist layer 324 cover a first area and a second area of the hard mask 2 layer 316 respectively. The first area and the second area of the hard mask 2 layer 316 may be used to form a first HBT 104 and a second HBT 106 in the following fabrication process. A width of the first area of the hard mask 2 layer 316 may be smaller than 100 nm (e.g., between 5 nm and 10 nm). A width of the second area of the hard mask 2 layer 316 may be equal to or larger than 0.1 µm.

The fabrication process 200 also includes etching the hard mask 2 layer 316 to form a second hard mask 162 and a fourth hard mask 166 (block 216, stage 300(8) of FIG. 3D). As an example, the etching may stop on the hard mask 1 layer 314. A width of the second hard mask 162 may be smaller than 100 nm (e.g., between 5 nm and 10 nm). A width of the fourth hard mask 166 may be equal to or larger than 0.1 µm.

Figure 3E:
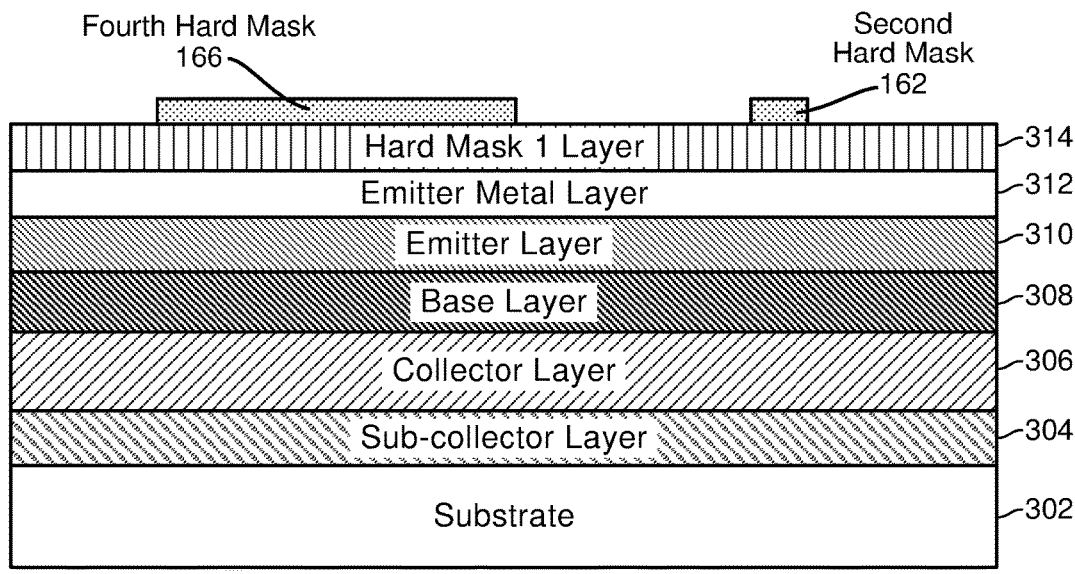
Figure 3E:
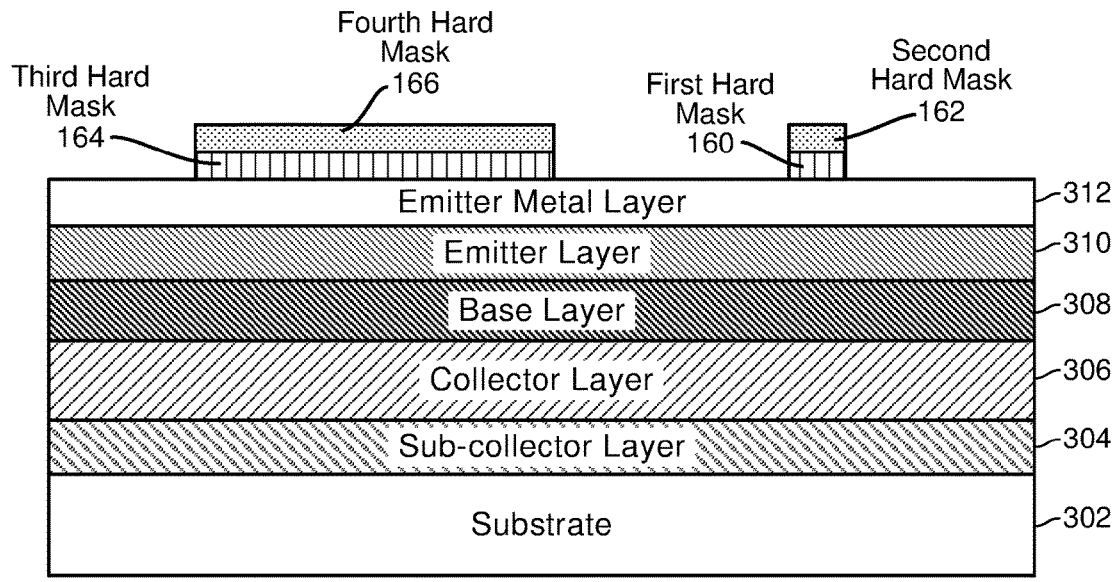

The fabrication process 200 also includes removing the first portion 322(1) of the dummy spacers 322 and the photoresist layer 324 (block 218, stage 300(9) of FIG. 3E). As an example, the first portion 322(1) of the dummy spacers 322 may be removed by wet etching. During the wet etching, the hard mask 1 layer 314 may serve as a protection layer for all layers covered by it. The photoresist layer 324 may be removed by stripping.

The fabrication process 200 also includes etching the hard mask 1 layer 314 to form a first hard mask 160 and a third hard mask 164 (block 220, stage 300(10) of FIG. 3E). As an example, the etching may stop on the emitter metal layer 312. A width of the first hard mask 160 may be smaller than 100 nm (e.g., between 5 nm and 10 nm). A width of the third hard mask 164 may be equal to or larger than 0.1 µm.

Figure 3F:
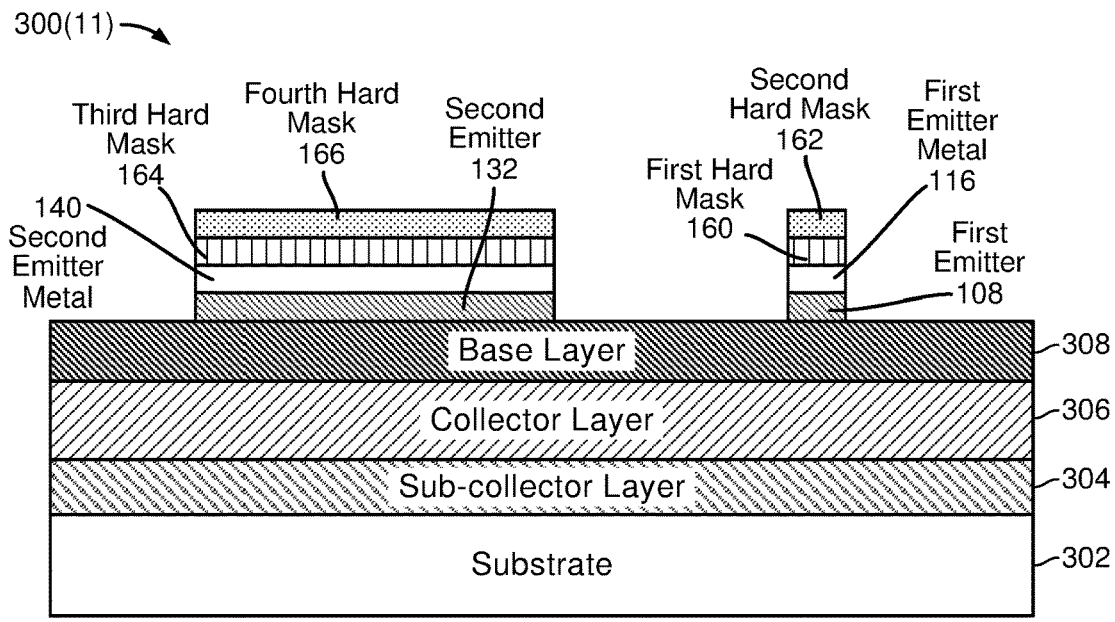
Figure 3F:
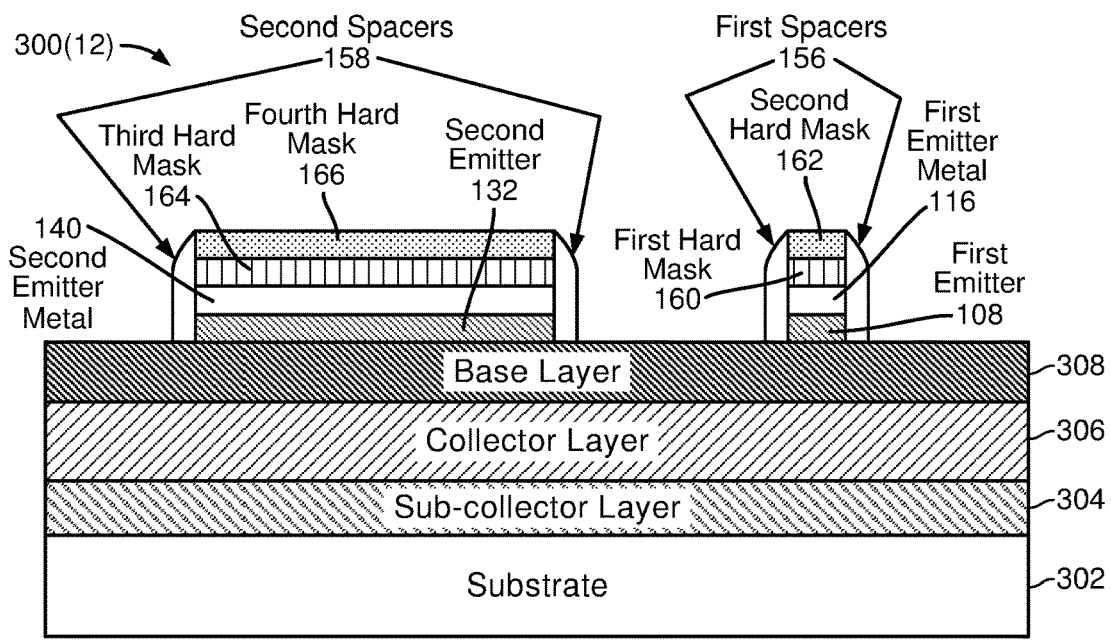

The fabrication process 200 also includes etching the emitter metal layer 312 and the emitter layer 310 to form a first emitter metal 116, a second emitter metal 140, a first emitter 108, and a second emitter 132 (block 222, stage 300(11) of FIG. 3F). As an example, the etching may stop on the base layer 308. The emitter metal layer 312 and the emitter layer 310 may be etched by dry etching. A width of the first emitter 108 may be smaller than 100 nm (e.g., between 5 nm and 10 nm). A width of the second emitter 132 may be equal to or larger than 0.1 µm.

The fabrication process 200 also includes depositing a $SiO_2$ layer and etching the $SiO_2$ layer to form first spacers 156 on sidewalls of the first emitter metal 116 and the first emitter 108 and second spacers 158 on sidewalls of the second emitter metal 140 and the second emitter 132 (block 224, stage 300(12) of FIG. 3F).

Figure 3G:
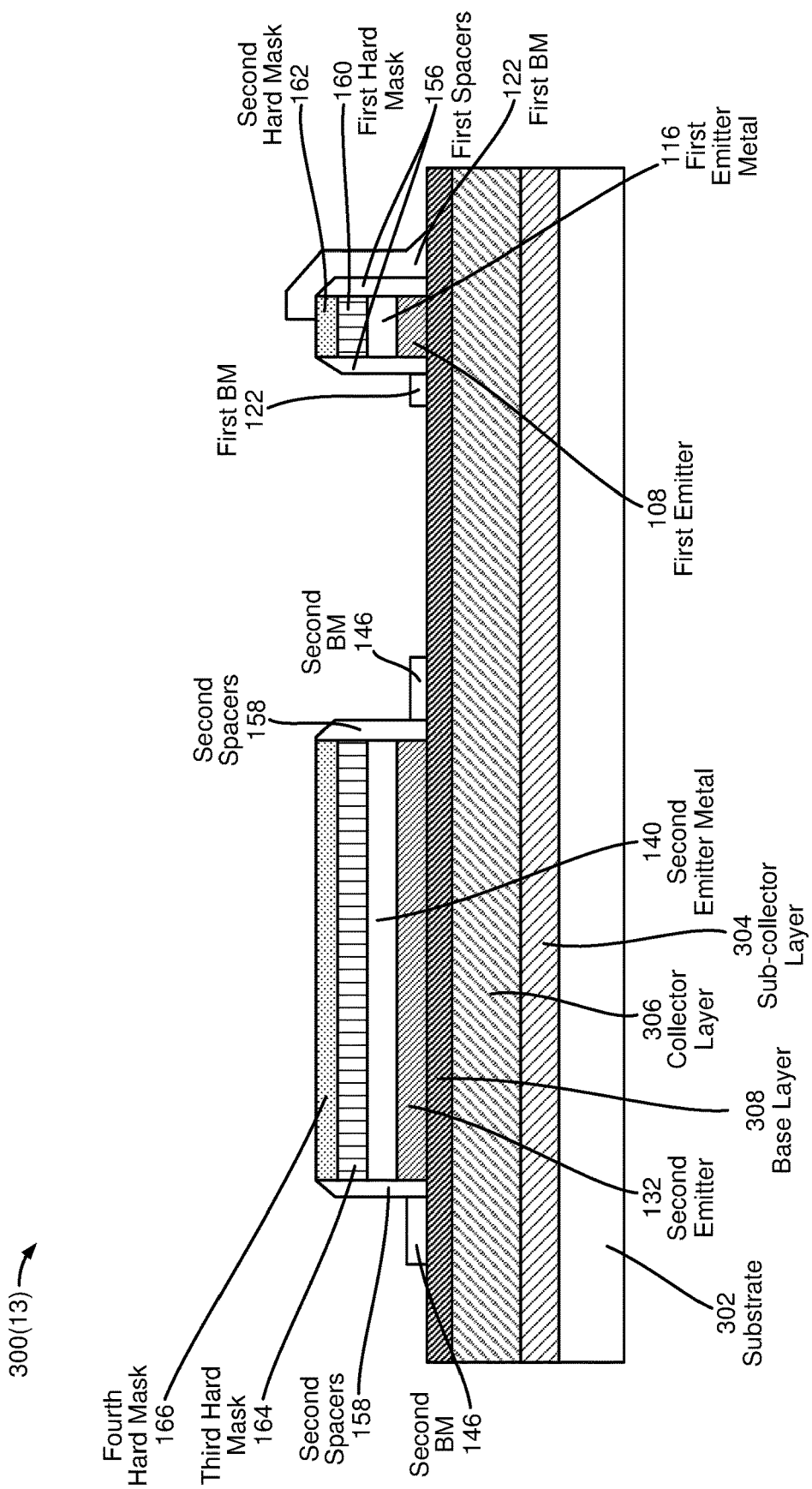

The fabrication process 200 also includes forming first BM 122 and second BM 146 on the base layer 308 (block 226, stage 300(13) of FIG. 3G). As an example, the first BM 122 and the second BM 146 may be formed by lift off process.

Figure 3H:
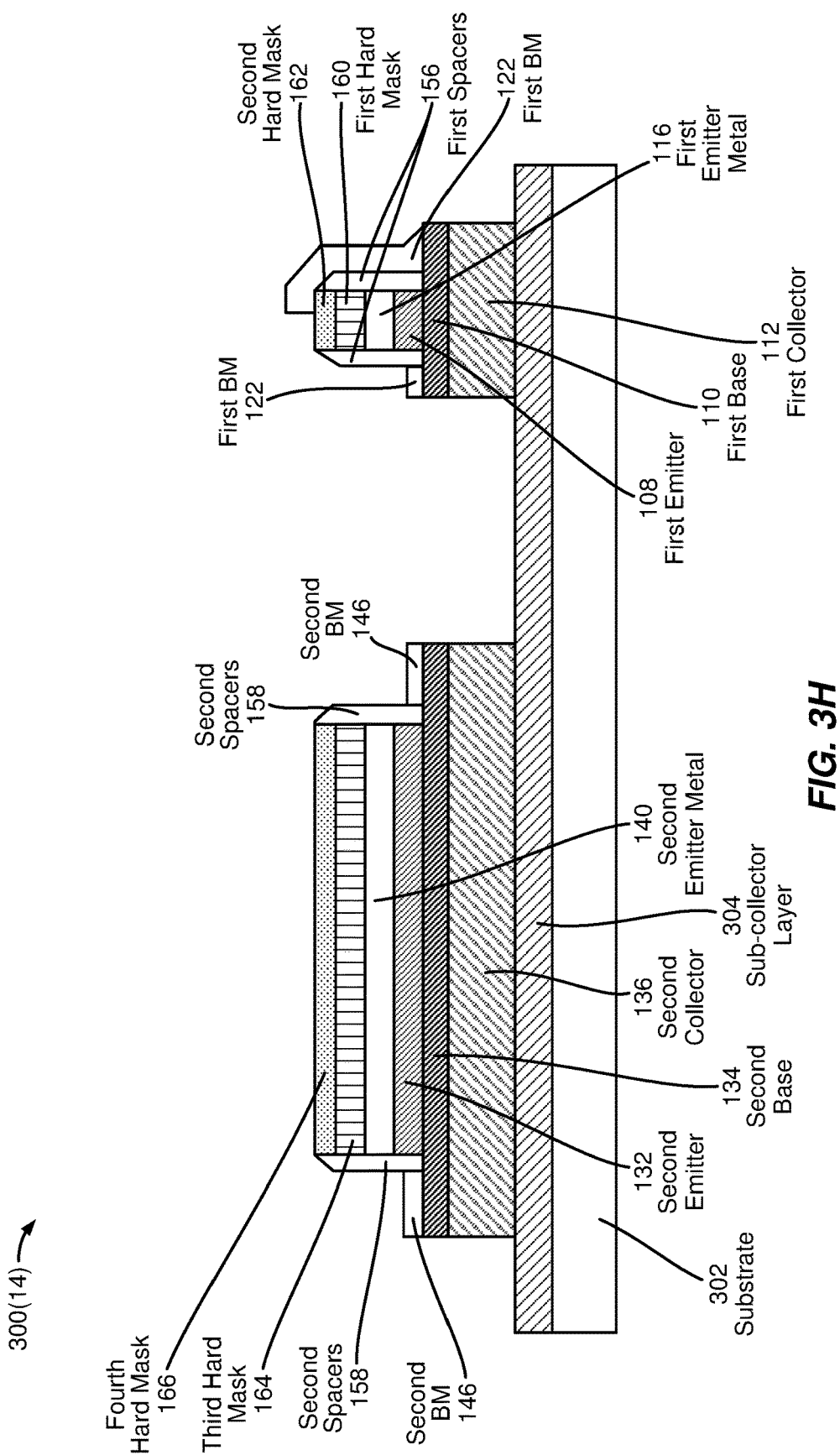

The fabrication process 200 also includes etching the base layer 308 and the collector layer 306 to form a first base 110, a second base 134, a first collector 112, and a second collector 136 (block 228, stage 300(14) of FIG. 3H). As an example, the etching may stop on the sub-collector layer 304. The base layer 308 and the collector layer 306 may be etched by wet etching.

Figure 3I:
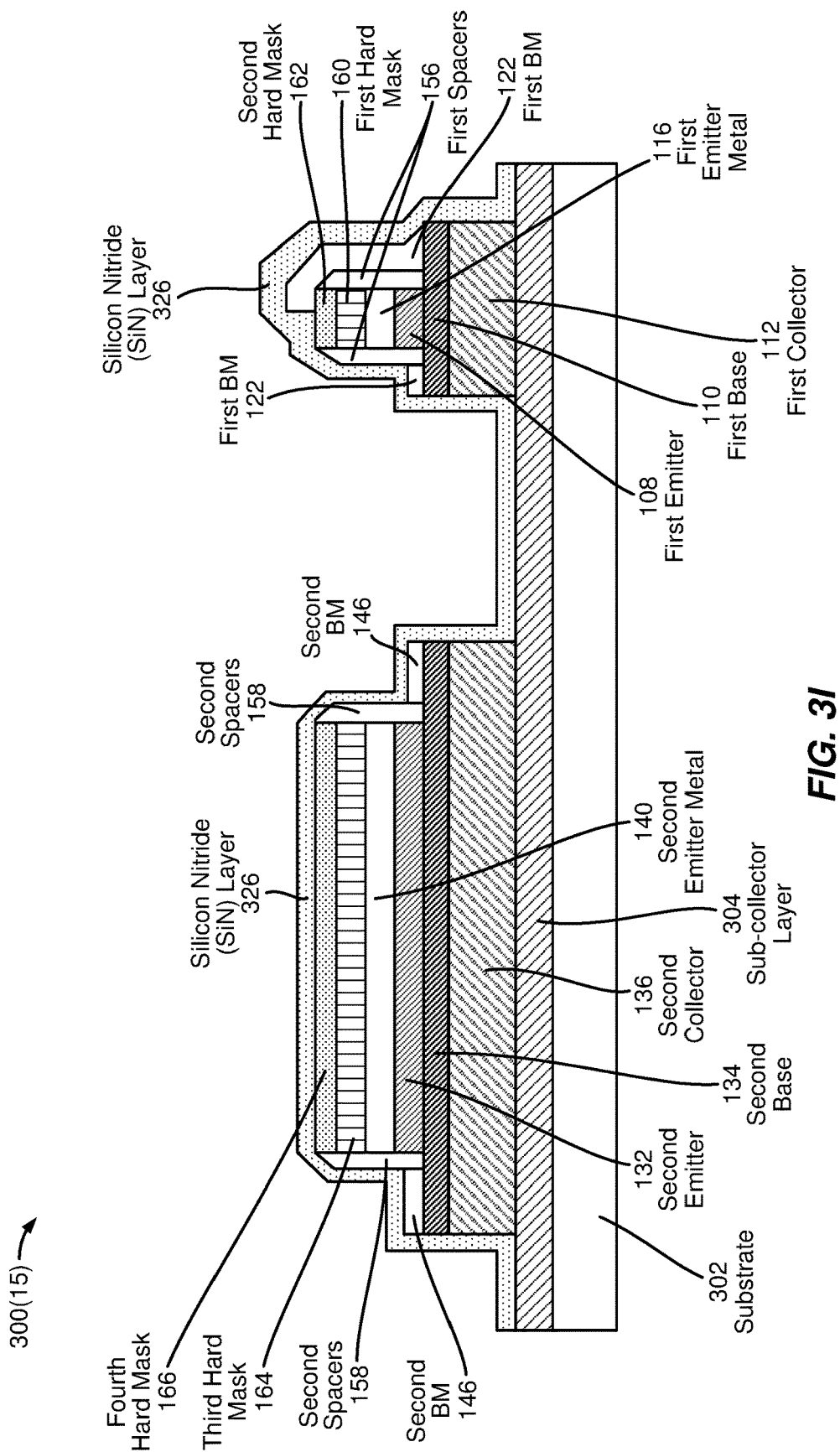

The fabrication process 200 also includes depositing a SiN layer 326 as a passivation layer (block 230, stage 300(15) of FIG. 3I).

Figure 3J:
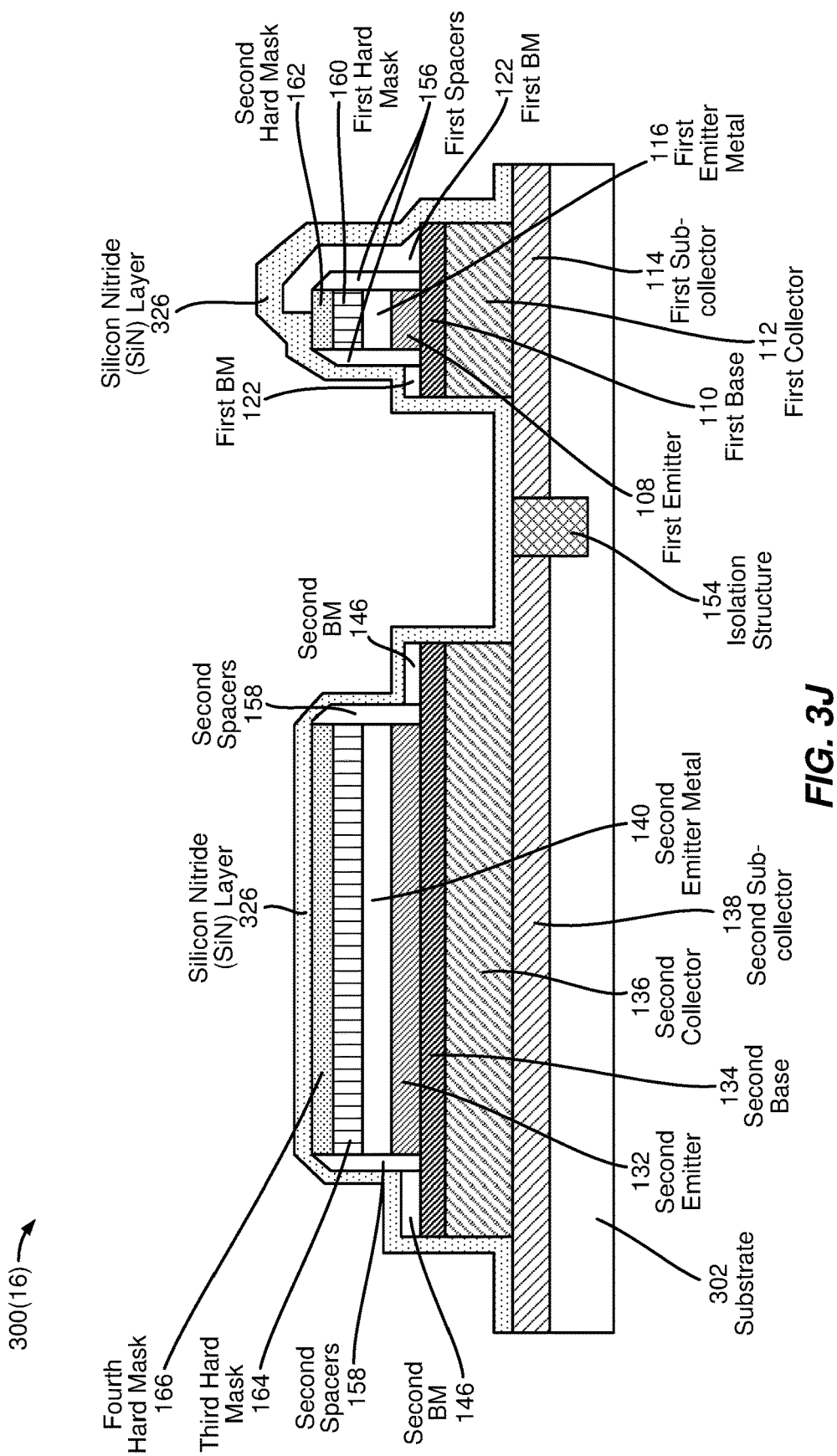

The fabrication process 200 also includes forming an isolation structure 154 in the sub-collector layer 304 and the substrate 302 (block 232, stage 300(16) of FIG. 3J). As an example, the isolation structure 154 may be formed by Helium (He) ion implantation into the sub-collector layer 304 and the substrate 302. The isolation structure 154 divides the sub-collector layer 304 into a first sub-collector 114 and a second sub-collector 138. The isolation structure 154 may electrically isolate a device on the first sub-collector 114 from a device on the second sub-collector 138.

Figure 3K:
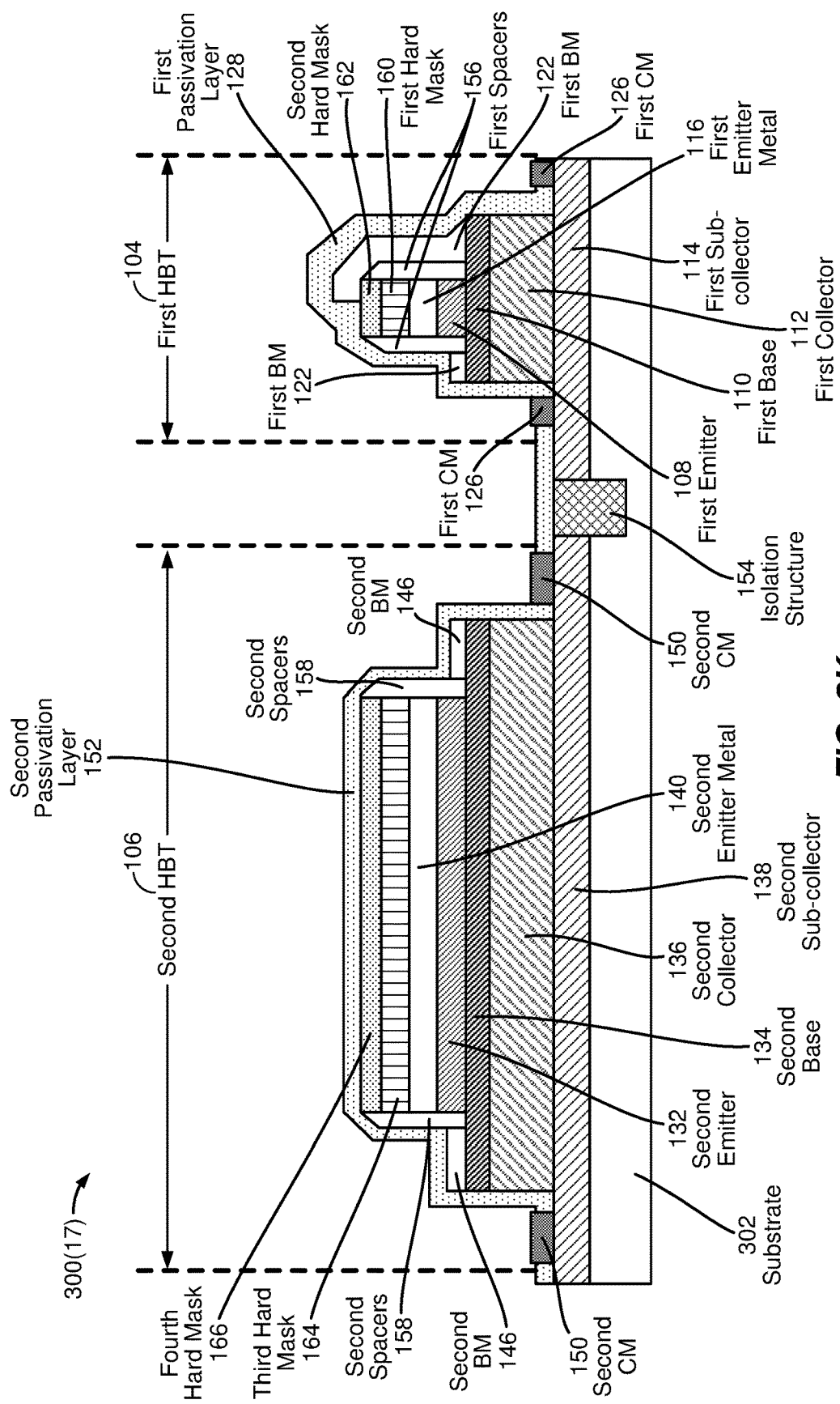

The fabrication process 200 also includes etching the SiN layer 326 and forming first CM 126 and second CM 150 on the first sub-collector 114 and the second sub-collector 138 respectively (block 234, stage 300(17) of FIG. 3K). As an example, the first CM 126 and the second CM 150 may divide the SiN layer 326 into a first passivation layer 128 and a second passivation layer 152. As mentioned above, the first area and the second area of the hard mask 2 layer 316 may be used to form the first HBT 104 and the second HBT 106. The first HBT 104 may comprise the first emitter metal 116, the first emitter 108, the first base 110, the first collector 112, the first sub-collector 114, the first spacers 156, the first BM 122, the first CM 126, and the first passivation layer 128. The second HBT 106 may comprise the second emitter metal 140, the second emitter 132, the second base 134, the second collector 136, the second sub-collector 138, the second spacers 158, the second BM 146, the second CM 150, and the second passivation layer 152. The first HBT 104 and the second HBT 106 are integrated on the substrate 302.

Figure 3L:
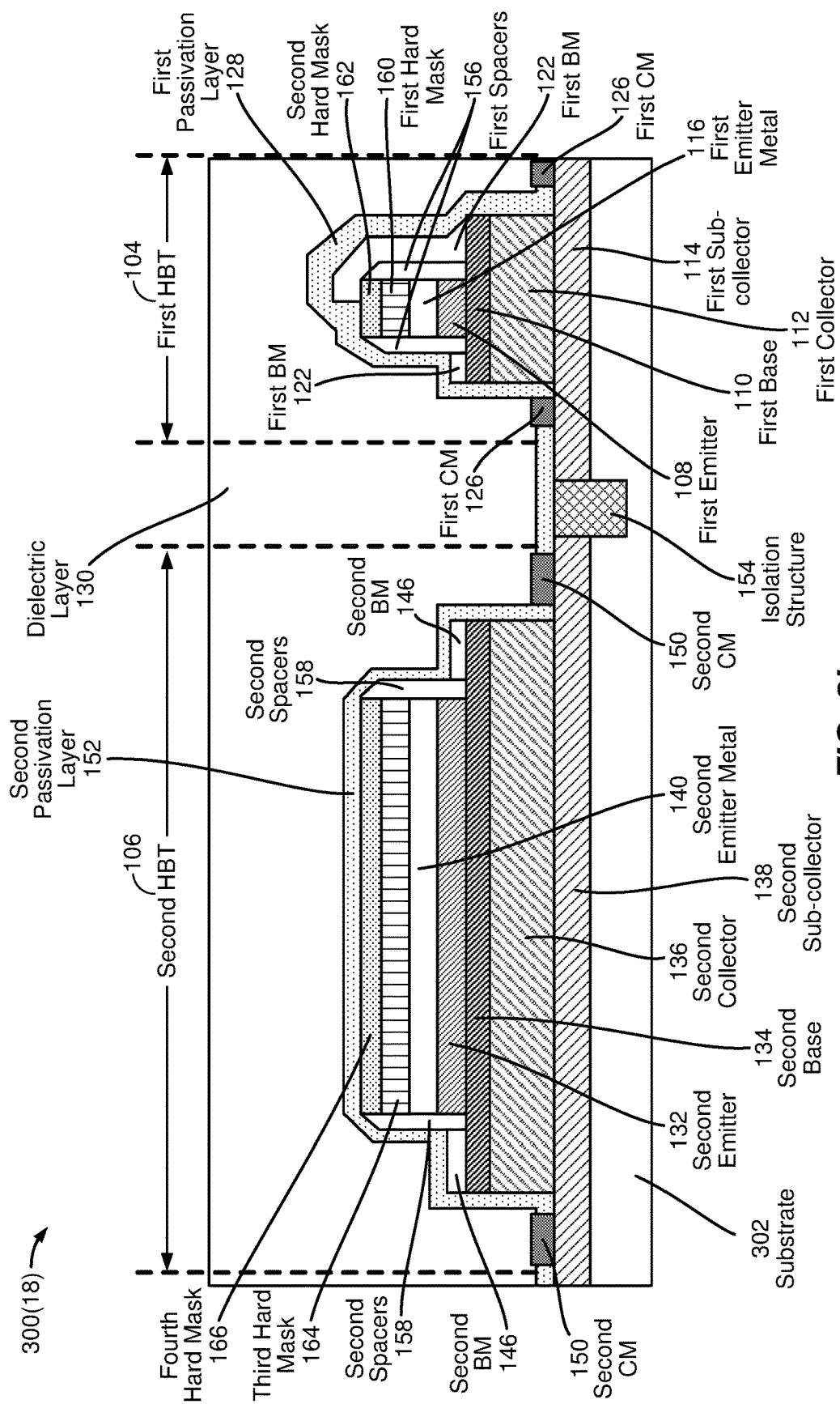

The fabrication process 200 further includes depositing a dielectric layer 130 to cover the first HBT 104 and the second HBT 106 (block 236, stage 300(18) of FIG. 3L). As an example, the dielectric layer 130 may comprise PI or BCB.

Figure 3M:
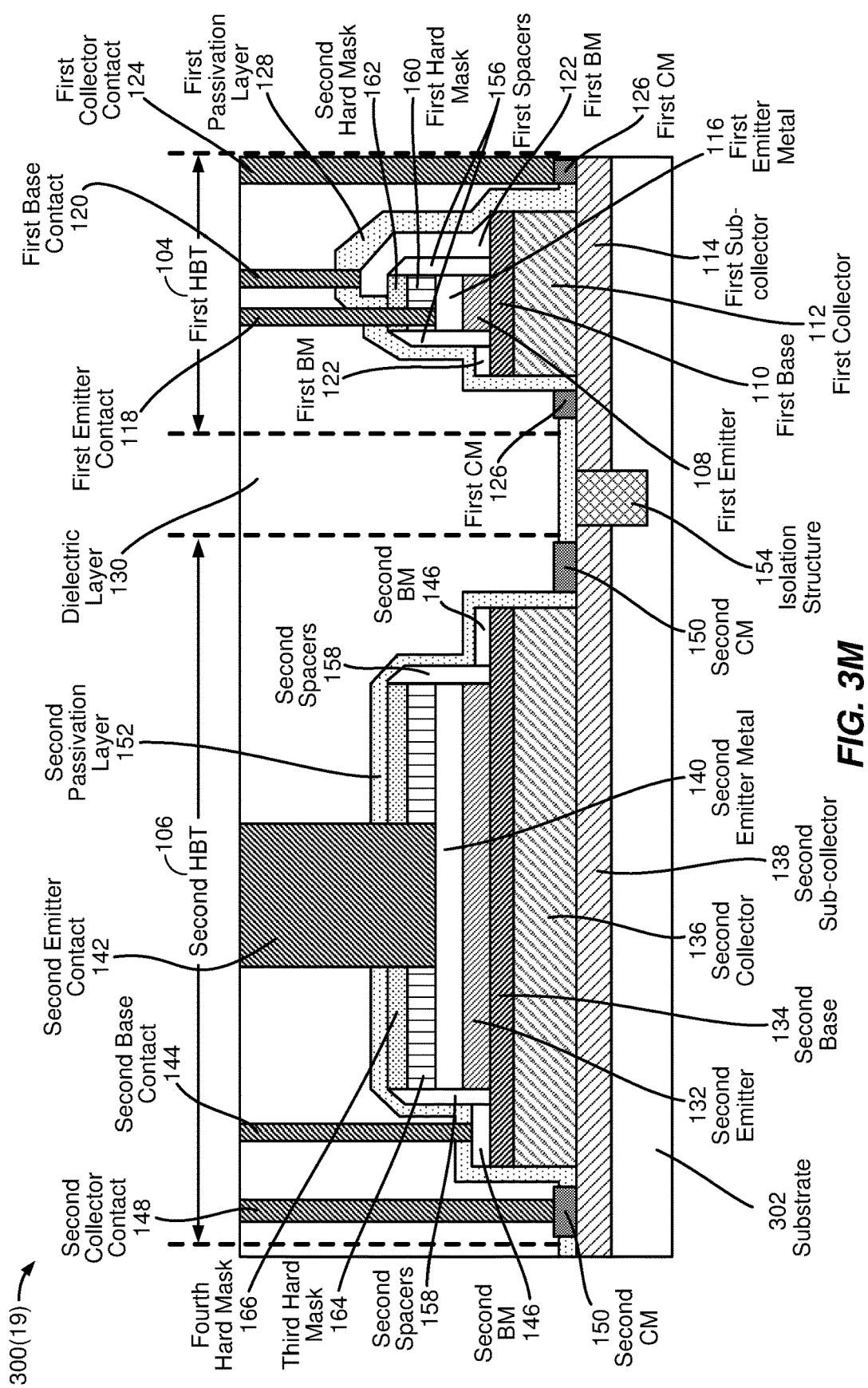

Next, the fabrication process 200 includes forming a first emitter contact 118, a first base contact 120, a first collector contact 124, a second emitter contact 142, a second base contact 144, and a second collector contact 148 (block 238, stage 300(19) of FIG. 3M). These contacts provide electrical connections to the first HBT 104 and the second HBT 106. The first HBT 104 may have an emitter width (e.g., the width of the first emitter 108) smaller than 100 nm (e.g., between 5 nm and 10 nm). The second HBT 106 may have an emitter width (e.g., the width of the second emitter 132) equal to or larger than 0.1 µm. As mentioned in the background, the first HBT 104 may be suitable for high speed applications and the second HBT 106 may be suitable for high power applications. Thus, the semiconductor device 100 may comprise an HBT for high speed applications (e.g., the first HBT 104) and an HBT for high power applications (e.g., the second HBT 106) integrated on a single die (e.g., the substrate 302).

The elements described herein are sometimes referred to as means for performing particular functions. In this regard, the first emitter 108 and the second emitter 132 are sometimes referred to herein as "means for emitting charger carriers." The first base 110 and the second base 134 are sometimes referred to herein as "means for controlling a number of charger carriers." The first collector 112 and the second collector 136 are sometimes referred to herein as "means for collecting charge carriers." According to a further aspect of the present disclosure, the aforementioned means may be any layer, module, or any apparatus configured to perform the functions recited by the aforementioned means.

The semiconductor device comprising two HBTs with different emitter widths integrated on a single die for both high power applications and high speed applications according to certain aspects disclosed herein may be provided in or integrated into any electronic device. Examples, without limitation, include a set top box, an entertainment unit, a navigation device, a communication device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, and a drone.

Figure 4:
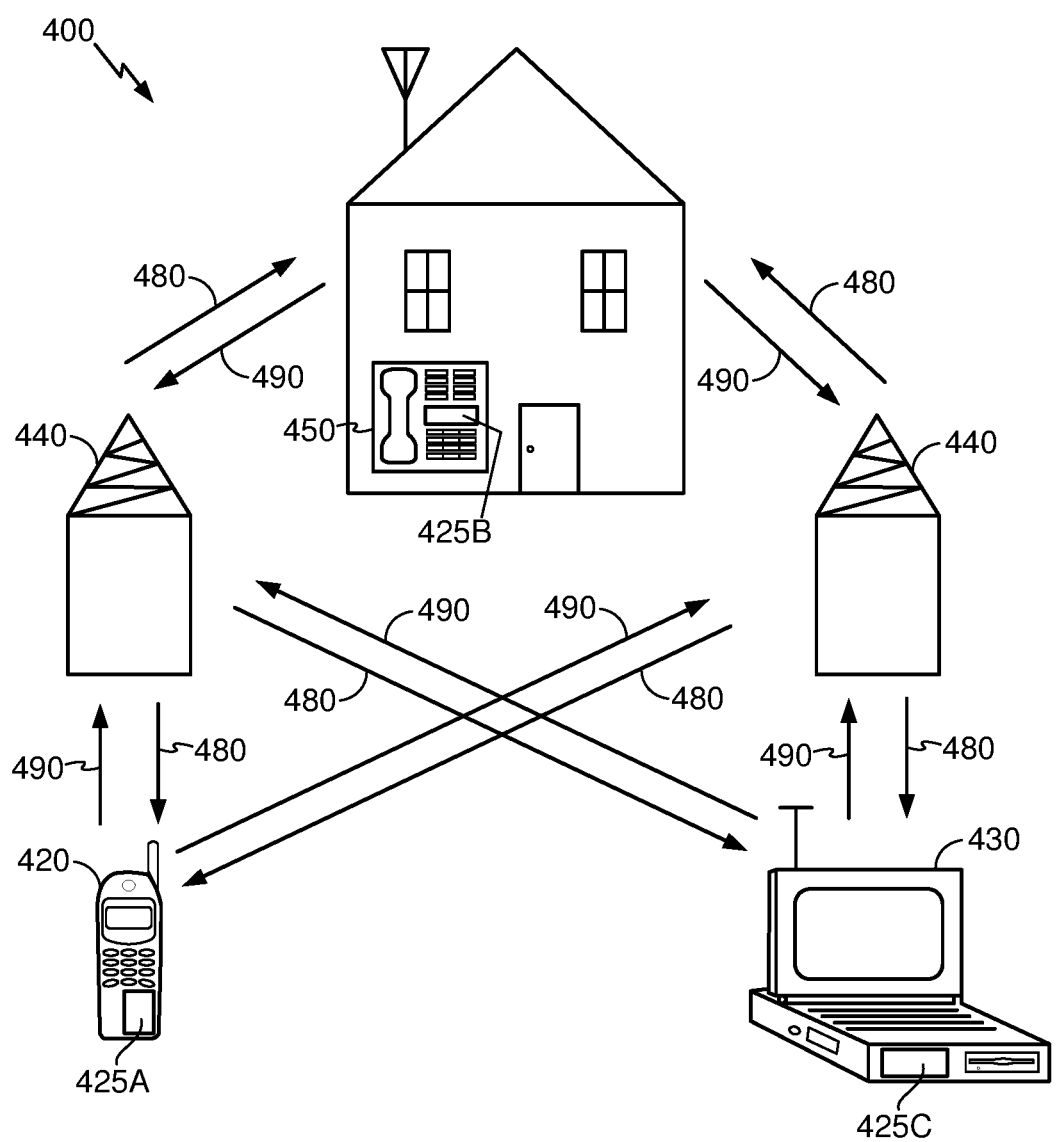
FIG. 4 is a block diagram showing an exemplary wireless communication system in which an aspect of the present disclosure may be employed.

In this regard, FIG. 4 is a block diagram showing an exemplary wireless communication system 400 in which an aspect of the present disclosure may be employed. For purposes of illustration, FIG. 4 shows three remote units 420, 430, and 450 and two base stations 440. It will be recognized that wireless communication systems may have many more remote units and base stations. Remote units 420, 430, and 450 include integrated circuit (IC) devices 425A, 425C, and 425B that may include the disclosed semiconductor device. It will be recognized that other devices may also include the disclosed semiconductor device, such as the base stations, switching devices, and network equipment. FIG. 4 shows forward link signals 480 from the base stations 440 to the remote units 420, 430, and 450 and reverse link signals 490 from the remote units 420, 430, and 450 to the base stations 440.

In FIG. 4, remote unit 420 is shown as a mobile telephone, remote unit 430 is shown as a portable computer, and remote unit 450 is shown as a fixed location remote unit in a wireless local loop system. For example, a remote unit may be a mobile phone, a hand-held personal communication systems (PCS) unit, a portable data unit such as a PDA, a GPS enabled device, a navigation device, a set top box, a music player, a video player, an entertainment unit, a fixed location data unit, such as a meter reading equipment, or other communication device that stores or retrieves data or computer instructions, or combinations thereof. Although FIG. 4 illustrates remote units according to the certain aspects of the present disclosure, the disclosure is not limited to these exemplary illustrated units. Certain aspects of the present disclosure may be suitably employed in many devices, which include the disclosed semiconductor device.

Those of skill in the art will further appreciate that the various illustrative logical blocks, modules, circuits, and algorithms described in connection with the certain aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the certain aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and features disclosed herein.

What is claimed is:

1. A semiconductor device, comprising:
   a first heterojunction bipolar transistor (HBT) on a die, wherein the first HBT comprises a first emitter, a first collector, and a first base between the first emitter and the first collector and wherein a width of the first emitter is less than 100 nanometers (nm); and
   a second HBT on the die, wherein the second HBT comprises a second emitter, a second collector, and a second base between the second emitter and the second collector and wherein a width of the second emitter is equal to or greater than 0.1 micron (μm).

2. The semiconductor device of claim 1, further comprising an isolation structure between the first HBT and the second HBT.

3. The semiconductor device of claim 1, wherein the die comprises at least one of a Gallium Arsenide (GaAs) substrate and an Indium Phosphide (InP) substrate.

4. The semiconductor device of claim 1, wherein the first emitter comprises at least one of Iridium Gallium Arsenide (InGaAs), GaAs, and InP, the first collector comprises at least one of GaAs and InP, and the first base comprises at least one of Indium Gallium Phosphide (InGaP), Aluminum Gallium Arsenide (AlGaAs), Gallium Iridium Antimonide (GaInSb), and InP.

5. The semiconductor device of claim 1, wherein the second emitter comprises at least one of InGaAs, GaAs, and InP, the second collector comprises at least one of GaAs and InP, and the second base comprises at least one of InGaP, AlGaAs, GaInSb, and InP.

6. The semiconductor device of claim 1, wherein the first HBT further comprises a first emitter metal and a first sub-collector.

7. The semiconductor device of claim 6, wherein the first emitter metal comprises at least one of Titanium (Ti)/Platinum (Pt)/Gold (Au), Titanium Nitride (TiN), Tungsten (W), and Tungsten Silicon Nitride (WSiN).

8. The semiconductor device of claim 6, wherein the first sub-collector comprises at least one of GaAs and InP.

9. The semiconductor device of claim 1, wherein the second HBT further comprises a second emitter metal and a second sub-collector.

10. The semiconductor device of claim 9, wherein the second emitter metal comprises at least one of Ti/Pt/Au, TiN, W, and WSiN.

11. The semiconductor device of claim 9, wherein the second sub-collector comprises at least one of GaAs and InP.

12. The semiconductor device of claim 1 integrated into a device selected from the group consisting of: a set top box; an entertainment unit; a navigation device; a communication device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; and a drone.

13. A method for fabricating a semiconductor device, comprising:
    forming a first heterojunction bipolar transistor (HBT) on a substrate, wherein the first HBT comprises a first emitter, a first collector, and a first base between the first emitter and the first collector and wherein a width of the first emitter is less than 100 nanometers (nm); and
    forming a second HBT on the substrate, wherein the second HBT comprises a second emitter, a second collector, and a second base between the second emitter and the second collector and wherein a width of the second emitter is equal to or greater than 0.1 micron (μm).

14. The method of claim 13, wherein the substrate comprises at least one of Gallium Arsenide (GaAs) and Indium Phosphide (InP).

15. The method of claim 13, wherein the forming the first HBT on the substrate and the forming the second HBT on the substrate comprise:
    forming a sub-collector layer on the substrate;
    forming a collector layer on the sub-collector layer;
    forming a base layer on the collector layer;
    forming an emitter layer on the base layer;
    forming an emitter metal layer on the emitter layer;
    forming a first hard mask layer on the emitter metal layer;
    forming a second hard mask layer on the first hard mask layer;
    forming a dummy layer on the second hard mask layer and patterning the dummy layer;
    forming an amorphous silicon layer on the dummy layer and the second hard mask layer;

etching the amorphous silicon layer to form dummy spacers and removing the dummy layer;

depositing a photoresist layer and patterning the photoresist layer;

etching the second hard mask layer;

removing the photoresist layer and the dummy spacers;

etching the first hard mask layer, the emitter metal layer, and the emitter layer;

depositing a Silicon Dioxide ($SiO_2$) layer and etching the $SiO_2$ layer to form first spacers and second spacers;

forming first base metals (BM) and second BM on the base layer;

etching the base layer and the collector layer;

depositing a passivation layer;

forming an isolation structure in the sub-collector layer and the substrate;

etching the passivation layer and forming first collector metals (CM) and second CM on the sub-collector layer;

depositing a dielectric layer; and forming contacts through the dielectric layer.

16. The method of claim 15, wherein the sub-collector layer comprises at least one of GaAs and InP.

17. The method of claim 15, wherein the emitter metal layer comprises at least one of Titanium (Ti)/Platinum (Pt)/Gold (Au), Titanium Nitride (TiN), Tungsten (W), and Tungsten Silicon Nitride (WSiN).

18. The method of claim 15, wherein the collector layer comprises at least one of GaAs and InP, the base layer comprises at least one of Indium Gallium Phosphide (InGaP), Aluminum Gallium Arsenide (AlGaAs), Gallium Indium Antimonide (GaInSb), and InP, and the emitter layer comprises at least one of Indium Gallium Arsenide (InGaAs), GaAs, and InP.

19. The method of claim 15, wherein the first hard mask layer comprises $SiO_2$ and the second hard mask layer comprises Silicon Nitride (SiN).

20. The method of claim 15, wherein the dummy layer comprises Silicon Germanium (SiGe).

21. The method of claim 15, wherein a thickness of the amorphous silicon layer is less than 100 nm.

22. The method of claim 15, wherein the first BM comprise Pt/Ti/Pt/Au and the second BM comprise Pt/Ti/Pt/Au.

23. The method of claim 15, wherein the passivation layer comprises SiN.

24. The method of claim 15, wherein the forming the isolation structure in the sub-collector layer and the substrate comprises Helium (He) ion implantation into the sub-collector layer and the substrate.

25. The method of claim 15, wherein the first CM comprise at least one of Au, Germanium (Ge), and Nickel (Ni)/Au and the second CM comprise at least one of Au, Ge, and Ni/Au.

* * * * *